(12) United States Patent
Vaillancourt et al.

(10) Patent No.: US 9,907,176 B2
(45) Date of Patent: Feb. 27, 2018

(54) SOLID ELECTROLYTIC CAPACITOR MODULE WITH IMPROVED PLANARITY

(71) Applicant: AVX Corporation, Fountain Inn, SC (US)

(72) Inventors: Glenn Vaillancourt, Buxton, ME (US); Ken Moulton, Shapleigh, ME (US); Scott McCarthy, Saco, ME (US); Jason Laforge, Naples, ME (US)

(73) Assignee: AVX Corporation, Fountain Inn, SC (US)

( * ) Notice: Subject to any disclaimer, the term of this patent is extended or adjusted under 35 U.S.C. 154(b) by 64 days.

(21) Appl. No.: 15/082,046

(22) Filed: Mar. 28, 2016

(65) Prior Publication Data

US 2017/0280563 A1 Sep. 28, 2017

(51) Int. Cl.
| | |
|---|---|
| *H05K 1/18* | (2006.01) |
| *H01G 9/028* | (2006.01) |
| *H01G 9/042* | (2006.01) |
| *H01G 9/052* | (2006.01) |
| *H01G 9/07* | (2006.01) |
| *H01G 9/08* | (2006.01) |
| *H01G 9/15* | (2006.01) |

(Continued)

(52) U.S. Cl.
CPC ............ *H05K 1/181* (2013.01); *H01G 9/028* (2013.01); *H01G 9/042* (2013.01); *H01G 9/0425* (2013.01); *H01G 9/0525* (2013.01); *H01G 9/07* (2013.01); *H01G 9/08* (2013.01); *H01G 9/15* (2013.01); *H01G 9/26* (2013.01); *H05K 3/303* (2013.01); *H05K 2201/10015* (2013.01)

(58) Field of Classification Search
CPC ..................................................... H05K 1/181

USPC .......................................................... 174/260
See application file for complete search history.

(56) References Cited

U.S. PATENT DOCUMENTS

| | | |
|---|---|---|
| 3,345,545 A | 10/1967 | Bourgault et al. |
| 4,085,435 A | 4/1978 | Galvagni |

(Continued)

FOREIGN PATENT DOCUMENTS

| | | |
|---|---|---|
| EP | 1 807 849 B1 | 3/2013 |
| JP | 2000-114121 A | 4/2000 |

(Continued)

OTHER PUBLICATIONS

International Search Report and Written Opinion for PCT/US2017/021254, dated May 22, 2017, 10 pages.

*Primary Examiner* — Hoa C Nguyen
*Assistant Examiner* — Stanley Tso
(74) *Attorney, Agent, or Firm* — Dority & Manning, P.A.

(57) ABSTRACT

A module containing a plurality of active capacitors and a sacrificial capacitor is provided. The active capacitors and sacrificial capacitor are aligned along a horizontal direction so that the side surfaces of their cases are parallel to each other. The particular arrangement of the active capacitors and sacrificial capacitor results in a module configuration where the anode terminations for the active capacitors and an external component of the lead frame for the sacrificial capacitor are coplanar so that the module can be mounted to a circuit board via the anode terminations and the external component of the lead frame in a mechanically and electrically stable manner. Further, the center of gravity of the module in the length and/or width directions can be located at a midpoint of the overall module length and/or width, which enhances the stability of the module when mounted to a circuit board.

16 Claims, 3 Drawing Sheets

(51) Int. Cl.
*H01G 9/26* (2006.01)
*H05K 3/30* (2006.01)

(56) References Cited

U.S. PATENT DOCUMENTS

| | | |
|---|---|---|
| 4,945,452 A | 7/1990 | Sturmer et al. |
| 5,195,019 A | 3/1993 | Hertz |
| 5,198,968 A | 3/1993 | Galvagni |
| 5,357,399 A | 10/1994 | Salisbury |
| 5,394,295 A | 2/1995 | Galvagni et al. |
| 5,457,862 A | 10/1995 | Sakata et al. |
| 5,473,503 A | 12/1995 | Sakata et al. |
| 5,495,386 A | 2/1996 | Kukkami |
| 5,729,428 A | 3/1998 | Sakata et al. |
| 5,812,367 A | 9/1998 | Kudoh et al. |
| 5,949,639 A | 9/1999 | Maeda et al. |
| 6,185,088 B1 | 2/2001 | Youker et al. |
| 6,191,936 B1 | 2/2001 | Webber et al. |
| 6,197,252 B1 | 3/2001 | Bishop et al. |
| 6,243,605 B1 | 6/2001 | Youker et al. |
| 6,251,124 B1 | 6/2001 | Youker et al. |
| 6,322,912 B1 | 11/2001 | Fife |
| 6,391,275 B1 | 5/2002 | Fife |
| 6,416,730 B1 | 7/2002 | Fife |
| 6,477,412 B1 | 11/2002 | Youker et al. |
| 6,527,937 B2 | 3/2003 | Fife |
| 6,576,099 B2 | 6/2003 | Kimmel et al. |
| 6,592,740 B2 | 7/2003 | Fife |
| 6,639,787 B2 | 10/2003 | Kimmel et al. |
| 6,674,635 B1 | 1/2004 | Fife et al. |
| 7,116,548 B2 | 10/2006 | Satterfield et al. |
| 7,220,397 B2 | 5/2007 | Kimmel et al. |
| 7,262,511 B2 | 8/2007 | Osako et al. |
| 7,341,705 B2 | 3/2008 | Schnitter |
| 7,381,396 B2 | 6/2008 | Thomas et al. |
| 7,419,926 B2 | 9/2008 | Schnitter et al. |
| 9,171,672 B2 | 10/2015 | Mcconnell et al. |
| 2011/0149467 A1 | 6/2011 | Azuma et al. |

FOREIGN PATENT DOCUMENTS

| | | |
|---|---|---|
| JP | 2000-277177 A | 10/2000 |
| JP | 2008-085168 A | 4/2008 |

SOLID ELECTROLYTIC CAPACITOR MODULE WITH IMPROVED PLANARITY

BACKGROUND OF THE INVENTION

Solid electrolytic capacitors (e.g., tantalum capacitors) have been a major contributor to the miniaturization of electronic circuits and are often used in devices such as implantable defibrillators and pacemakers, where the smaller circuitry results in a device that is not only easier to implant into the patient, but that also allows for the inclusion of a larger battery in the device. The use of a larger battery, in turn, prolongs the longevity of the device. One manner in which the area occupied by solid electrolytic capacitors has been reduced is to incorporate a plurality of solid electrolytic capacitors into a single module as described in U.S. Pat. Nos. 6,185,088, 6,243,605, 6,251,124, and 6,477,412 to Youker, et al., where the arrangement of the capacitors in the module results in the module occupying less space on a circuit board than if the bases (e.g., anode termination ends) of each of the capacitors in the module were individually mounted onto the circuit board. However, one problem with the module design described in U.S. Pat. Nos. 6,185,088, 6,243,605, 6,251,124, and 6,477,412 to Youker, et al. is that the anode termination ends of the capacitors can become misaligned or non-planar during the assembly of the module into its outer shell, as well as when the cathode terminations are connected to a conductor. As a result, one or more of the anode termination ends may not be planar with the remaining anode termination ends so that sufficient contact between each individual anode termination and the circuit board is not made after the module is mounted to the circuit board. In addition, a conductor that connects the cathode termination ends of the plurality of solid electrolytic capacitors to each other and runs down a side of the module to the circuit board may vary in height compared to the height of the plurality of solid electrolytic capacitors, which can also affect the integrity of the connection between the conductor and the circuit board or the connection between one or more of the anode terminations and the circuit board due to the lack of planarity of the lower surfaces of the capacitors, the upper surfaces of the capacitors, or both.

As such, a need remains for a solid electrolytic capacitor module that includes a plurality of solid electrolytic capacitors, where the anode terminations and any conductor or lead frame used to connect the cathode terminations to the circuit board are planar with each other so that the module can be mounted to the circuit in a mechanically and electrically stable manner.

SUMMARY OF THE INVENTION

In accordance with one embodiment of the present invention, a solid electrolytic capacitor module having an upper module surface and a lower module surface is disclosed. The module includes a plurality of active capacitors, a sacrificial capacitor, and a conductor. Each active capacitor includes a capacitor element and an active capacitor case that encapsulates the capacitor element. The active capacitor case includes an upper surface adjacent the upper module surface, a lower surface adjacent the lower module surface, opposing side surfaces, a front surface, and a rear surface; an anode termination that has a first external component contacting and parallel to the lower surface of the active capacitor case; and a cathode termination having a first external component contacting and parallel to the upper surface of the active capacitor case. The sacrificial capacitor includes a sacrificial capacitor case, wherein the sacrificial capacitor case includes an upper surface, a lower surface, opposing side surfaces, a front surface, and a rear surface, where the plurality of active capacitors and the sacrificial capacitor are aligned along a horizontal direction so that the side surfaces of the active capacitor cases and the side surfaces of the sacrificial capacitor case are parallel to each other. Further, the conductor is postioned along the horizontal direction at the upper module surface so that the conductor is in contact with the first external component of the cathode termination of each of the plurality of active capacitors.

In accordance with another embodiment of the present invention, a method of assembling a solid electrolytic capacitor module having an upper module surface and a lower module surface is disclosed. The method includes providing a plurality of active capacitors, where each of the plurality of active capacitors includes a capacitor element and an active capacitor case that encapsulates the capacitor element, where the active capacitor case includes an upper surface adjacent the upper module surface, a lower surface adjacent the lower module surface, opposing side surfaces, a front surface, and a rear surface; and providing a sacrificial capacitor, where the sacrificial capacitor includes a sacrificial capacitor case, where the sacrificial capacitor case includes an upper surface, a lower surface, opposing side surfaces, a front surface, and a rear surface. The method further includes positioning the plurality of active capacitors on a planar surface so that the lower surface of each of the active capacitor cases is in contact with the planar surface, where the plurality of active capacitors are aligned along a horizontal direction so that the side surfaces of the active capacitor cases are parallel to each other; and positioning the sacrificial capacitor adjacent one of the side surfaces of one of the plurality of active capacitors so that the lower surface of the sacrificial capacitor case is in contact with the planar surface, wherein the sacrificial capacitor is aligned along the horizontal direction so that the side surfaces of the sacrificial capacitor case and the side surfaces of the active capacitor cases are parallel to each other.

Other features and aspects of the present invention are set forth in greater detail below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which.

Repeat use of reference characters in the present specification and drawings is intended to represent the same or analogous features or elements of the present invention.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present invention.

Generally speaking, the present invention is directed to a solid electrolytic capacitor module having an upper module surface and a lower module surface, where the module contains a plurality of active capacitors each having an anode termination and a cathode termination; a sacrificial capacitor that can include a lead frame; and a conductor that electrically connects the cathode terminations to each other in series along a horizontal (x) direction, where the conductor can also electrically connect the cathode terminations to the lead frame. The particular arrangement of the active capacitors and the sacrificial capacitor within the module, where the plurality of active capacitors and the sacrificial capacitor are aligned in a single row and are aligned in a horizontal (x) direction so that the side surfaces of the active capacitor cases and the side surfaces of the sacrificial capacitor case are parallel to each other results in a configuration where the anode terminations for each of the active capacitors and an external component of the lead frame for the sacrificial capacitor are generally coplanar with each other. As a result, the module can be mounted to the circuit board via the anode terminations and the lead frame in a mechanically and electrically stable manner.

Further, the particular manner in which the active capacitors and the sacrificial capacitor are generally be aligned in a single row in parallel along the length direction (horizontal or x direction) of the module is such that the center of gravity of the module in the length direction (horizontal or x direction) and/or width direction (transverse or z direction) can be located at respective midpoints of the overall length and/or width of the module, which can further enhance the stability and planarity of the module when mounted to a circuit board. For instance, the difference in distance from a horizontal plane (e.g., a plane positioned some distance away from a lower surface of the module) between a lower surface of the case of the sacrificial capacitor and a lower surface of the case of each of the active capacitors can be less than about 0.005 inches (0.127 millimeters), such as less than about 0.004 inches (0.102 millimeters), such as less than about 0.003 inches (0.076 millimeters), such as less than about 0.002 inches (0.051 millimeters), such as less than about 0.001 inches (0.026 millimeters). In one particular embodiment, the difference in distance from a horizontal plane between a lower surface of the case of the sacrificial capacitor and a lower surface of the case of each of the active capacitors can be 0 inches (0 millimeters). Moreover, in one particular embodiment, the sacrificial capacitor case and the active capacitor cases can have substantially identical dimensions, which can further enhance the mechanical stability of the module.

As discussed in more detail below, each active capacitor in the module includes a capacitor element and a case that encapsulates the capacitor element. The capacitor element can generally include an anode, a dielectric layer overlying the anode, and a cathode overlying the dielectric layer that includes a solid electrolyte. The case for each active capacitor can include an upper surface adjacent the upper module surface and a lower surface adjacent the lower module surface to define a height, a first side surface and a second side surface to define a length, and a front surface and a rear surface to define a width, where the height can be greater than the length and the width. In addition, each active capacitor includes an anode termination that is electrically connected to the anode, where the anode termination has a first external component contacting and parallel to the lower surface of the case and a second external component contacting and parallel to the first side surface of the case, and a cathode termination having a first external component contacting and parallel to the upper surface of the case and a second external component contacting and parallel to the first side surface of the case. Further, the conductor is postioned above and in contact with the first external component of the cathode termination of each of the plurality of solid electrolytic capacitors. In addition, the sacrificial capacitor also includes a case, where the case can include an upper surface and a lower surface to define a height, a first side surface and a second side surface to define a length, and a front surface and a rear surface to define a width, where the height can be greater than the length and the width. The sacrificial capacitor is free of a capacitor element and includes a lead frame that extends from such its upper surface to its lower surface such that the sacrificial capacitor can be described as a case in which a shorted lead frame is contained.

The plurality of active capacitors can each contain a capacitor element that includes an anode, a dielectric layer overlying the anode, and a cathode overlying the dielectric layer that includes a solid electrolyte. The anode may be formed from a valve metal composition having a high specific charge, such as about 5,000 µF*V/g or more, in some embodiments about 25,000 µF*V/g or more, in some embodiments about 40,000 µF*V/g or more, and in some embodiments, from about 70,000 to about 200,000 µF*V/g or more. The valve metal composition contains a valve metal (i.e., metal that is capable of oxidation) or valve metal-based compound, such as tantalum, niobium, aluminum, hafnium, titanium, alloys thereof, oxides thereof, nitrides thereof, and so forth. For example, the valve metal composition may contain an electrically conductive oxide of niobium, such as niobium oxide having an atomic ratio of niobium to oxygen of $1:1.0\pm1.0$, in some embodiments $1:1.0\pm0.3$, in some embodiments $1:1.0\pm0.1$, and in some embodiments, $1:1.0\pm0.05$. For example, the niobium oxide may be $NbO_{0.7}$, $NbO_{1.0}$, $NbO_{1.1}$, and $NbO_2$. In a preferred embodiment, the composition contains $NbO_{1.0}$, which is a conductive niobium oxide that may remain chemically stable even after sintering at high temperatures. Examples of such valve metal oxides are described in U.S. Pat. No. 6,322,912 to Fife; U.S. Pat. No. 6,391,275 to Fife et al.; U.S. Pat. No. 6,416,730 to Fife et al.; U.S. Pat. No. 6,527,937 to Fife; U.S. Pat. No. 6,576,099 to Kimmel, et al.; U.S. Pat. No. 6,592,740 to Fife, et al.; and U.S. Pat. No. 6,639,787 to Kimmel, et al.; and U.S. Pat. No. 7,220,397 to Kimmel, et al., as well as U.S. Patent Application Publication Nos. 2005/0019581 to Schnitter; 2005/0103638 to Schnitter, et al.; 2005/0013765 to Thomas, et al., all of which are incorporated herein in their entirety by reference thereto for all purposes.

Conventional fabricating procedures may generally be utilized to form the anode. In one embodiment, a tantalum or niobium oxide powder having a certain particle size is first selected. For example, the particles may be flaked, angular, nodular, and mixtures or variations thereof. The particles also typically have a screen size distribution of at least about 60 mesh, in some embodiments from about 60 to about 325 mesh, and in some embodiments, from about 100 to about 200 mesh. Further, the specific surface area is from about 0.1 to about 10.0 m$^2$/g, in some embodiments from about 0.5 to about 5.0 m$^2$/g, and in some embodiments, from about 1.0 to about 2.0 m$^2$/g. The term "specific surface area" refers to the surface area determined by the physical gas adsorption (B.E.T.) method of Bruanauer, Emmet, and Teller, Journal of American Chemical Society, Vol. 60, 1938, p. 309, with nitrogen as the adsorption gas. Likewise, the bulk (or Scott) density is typically from about 0.1 to about 5.0 g/cm$^3$, in some embodiments from about 0.2 to about 4.0 g/cm$^3$, and in some embodiments, from about 0.5 to about 3.0 g/cm$^3$.

To facilitate the construction of the anode, other components may be added to the electrically conductive particles. For example, the electrically conductive particles may be optionally mixed with a binder and/or lubricant to ensure that the particles adequately adhere to each other when pressed to form the anode body. Suitable binders may include camphor, stearic and other soapy fatty acids, Carbowax (Union Carbide), Glyptal (General Electric), polyvinyl alcohols, naphthalene, vegetable wax, and microwaxes (purified paraffins). The binder may be dissolved and dispersed in a solvent. Exemplary solvents may include water, alcohols, and so forth. When utilized, the percentage of binders and/or lubricants may vary from about 0.1% to about 8% by weight of the total mass. It should be understood, however, that binders and lubricants are not required in the present invention.

The resulting powder may be compacted using any conventional powder press mold. For example, the press mold may be a single station compaction press using a die and one or multiple punches. Alternatively, anvil-type compaction press molds may be used that use only a die and single lower punch. Single station compaction press molds are available in several basic types, such as cam, toggle/knuckle and eccentric/crank presses with varying capabilities, such as single action, double action, floating die, movable platen, opposed ram, screw, impact, hot pressing, coining or sizing. The powder may be compacted around an anode lead (e.g., tantalum wire). It should be further appreciated that the anode lead may alternatively be attached (e.g., welded) to the anode body subsequent to pressing and/or sintering of the anode body. After compression, any binder/lubricant may be removed by heating the pellet under vacuum at a certain temperature (e.g., from about 150° C. to about 500° C.) for several minutes. Alternatively, the binder/lubricant may also be removed by contacting the pellet with an aqueous solution, such as described in U.S. Pat. No. 6,197,252 to Bishop, et al., which is incorporated herein in its entirety by reference thereto for all purposes. Thereafter, the pellet is sintered to form a porous, integral mass. For example, in one embodiment, the pellet may be sintered at a temperature of from about 1200° C. to about 2000° C., and in some embodiments, from about 1500° C. to about 1800° C. under vacuum or an inert atmosphere. Upon sintering, the pellet shrinks due to the growth of bonds between the particles. In addition to the techniques described above, any other technique for constructing the anode body may also be utilized in accordance with the present invention, such as described in U.S. Pat. No. 4,085,435 to Galvagni; U.S. Pat. No. 4,945,452 to Sturmer, et al.; U.S. Pat. No. 5,198,968 to Galvagni; U.S. Pat. No. 5,357,399 to Salisbury; U.S. Pat. No. 5,394,295 to Galvagni, et al.; U.S. Pat. No. 5,495,386 to Kulkarni; and U.S. Pat. No. 6,322,912 to Fife, which are incorporated herein in their entirety by reference thereto for all purposes.

Although not required, the thickness of the anode may be selected to improve the electrical performance of the capacitor. For example, the thickness of the anode may be about 4 millimeters or less, in some embodiments from about 0.05 to about 3.75 millimeters, and in some embodiments, from about 0.1 to about 3.5 millimeters. The shape of the anode may also be selected to improve the electrical properties of the resulting capacitor. For example, the anode may have a shape that is curved, sinusoidal, rectangular, U-shaped, V-shaped, etc. The anode may also have a "fluted" shape in that it contains one or more furrows, grooves, depressions, or indentations to increase the surface to volume ratio to minimize ESR and extend the frequency response of the capacitance. Such "fluted" anodes are described, for instance, in U.S. Pat. No. 6,191,936 to Webber, et al.; U.S. Pat. No. 5,949,639 to Maeda, et at; and U.S. Pat. No. 3,345,545 to Bourqault et al., as well as U.S. Patent Application Publication No. 2005/0270725 to Hahn, et al., all of which are incorporated herein in their entirety by reference thereto for all purposes.

Once constructed, the anode may be anodized so that a dielectric layer is formed over and/or within the anode. Anodization is an electrochemical process by which the anode is oxidized to form a material having a relatively high dielectric constant. For example, a niobium oxide (NbO) anode may be anodized to niobium pentoxide ($Nb_2O_5$). Typically, anodization is performed by initially applying an electrolyte to the anode, such as by dipping anode into the electrolyte. The electrolyte is generally in the form of a liquid, such as a solution (e.g., aqueous or non-aqueous), dispersion, melt, etc. A solvent is generally employed in the electrolyte, such as water (e.g., deionized water); ethers (e.g., diethyl ether and tetrahydrofuran); alcohols (e.g., methanol, ethanol, n-propanol, isopropanol, and butanol); triglycerides; ketones (e.g., acetone, methyl ethyl ketone, and methyl isobutyl ketone); esters (e.g., ethyl acetate, butyl acetate, diethylene glycol ether acetate, and methoxypropyl acetate); amides (e.g., dimethylformamide, dimethylacetamide, dimethylcaprylic/capric fatty acid amide and N-alkylpyrrolidones); nitriles (e.g., acetonitrile, propionitrile, butyronitrile and benzonitrile); sulfoxides or sulfones (e.g., dimethyl sulfoxide (DMSO) and sulfolane); and so forth. The solvent may constitute from about 50 wt. % to about 99.9 wt. %, in some embodiments from about 75 wt. % to about 99 wt. %, and in some embodiments, from about 80 wt. % to about 95 wt. % of the electrolyte. Although not necessarily required, the use of an aqueous solvent (e.g., water) is often desired to help achieve the desired oxide. In fact, water may constitute about 50 wt. % or more, in some embodiments, about 70 wt. % or more, and in some embodiments, about 90 wt. % to 100 wt. % of the solvent(s) used in the electrolyte.

The electrolyte is ionically conductive and may have an ionic conductivity of about 1 milliSiemens per centimeter ("mS/cm") or more, in some embodiments about 30 mS/cm or more, and in some embodiments, from about 40 mS/cm to about 100 mS/cm, determined at a temperature of 25° C. To enhance the ionic conductivity of the electrolyte, a compound may be employed that is capable of dissociating in the solvent to form ions. Suitable ionic compounds for this purpose may include, for instance, acids, such as hydrochloric acid, nitric acid, sulfuric acid, phosphoric acid, polyphosphoric acid, boric acid, boronic acid, etc.; organic acids, including carboxylic acids, such as acrylic acid, methacrylic acid, malonic acid, succinic acid, salicylic acid, sulfosalicylic acid, adipic acid, maleic acid, malic acid, oleic acid, gallic acid, tartaric acid, citric acid, formic acid, acetic acid, glycolic acid, oxalic acid, propionic acid, phthalic acid, isophthalic acid, glutaric acid, gluconic acid, lactic acid, aspartic acid, glutaminic acid, itaconic acid, trifluoroacetic acid, barbituric acid, cinnamic acid, benzoic acid, 4-hydroxybenzoic acid, aminobenzoic acid, etc.; sulfonic acids, such as methanesulfonic acid, benzenesulfonic acid, toluenesulfonic acid, trifluoromethanesulfonic acid, styrenesulfonic acid, naphthalene disulfonic acid, hydroxybenzenesulfonic acid, dodecylsulfonic acid, dodecylbenzenesulfonic acid, etc.; polymeric acids, such as poly(acrylic) or poly(methacrylic) acid and copolymers thereof (e.g., maleic-acrylic, sulfonic-acrylic, and styrene-acrylic copolymers), carageenic acid, carboxymethyl cellulose, alginic acid, etc.; and so forth. The concentration of ionic compounds is selected to achieve the desired ionic conductivity. For example, an acid (e.g., phosphoric acid) may constitute from about 0.01 wt. % to about 5 wt. %, in some embodiments from about 0.05 wt. % to about 0.8 wt. %, and in some embodiments, from about 0.1 wt. % to about 0.5 wt. % of the electrolyte. If desired, blends of ionic compounds may also be employed in the electrolyte.

A current is passed through the electrolyte to form the dielectric layer. The value of voltage manages the thickness of the dielectric layer. For example, the power supply may be initially set up at a galvanostatic mode until the required voltage is reached. Thereafter, the power supply may be switched to a potentiostatic mode to ensure that the desired dielectric thickness is formed over the surface of the anode. Of course, other known methods may also be employed, such as pulse or step potentiostatic methods. The voltage typically ranges from about 4 to about 200 V, and in some embodiments, from about 9 to about 100 V. During anodic oxidation, the electrolyte can be kept at an elevated temperature, such as about 30° C. or more, in some embodiments from about 40° C. to about 200° C., and in some embodiments, from about 50° C. to about 100° C. Anodic oxidation can also be done at ambient temperature or lower. The resulting dielectric layer may be formed on a surface of the anode and within its pores.

Once the dielectric layer is formed, a protective coating may optionally be applied, such as one made of a relatively insulative resinous material (natural or synthetic). Such materials may have a specific resistivity of greater than about 10 Ω/cm, in some embodiments greater than about 100, in some embodiments greater than about 1,000 Ω/cm, in some embodiments greater than about $1 \times 10^5$ Ω/cm, and in some embodiments, greater than about $1 \times 10^{10}$ Ω/cm. Some resinous materials that may be utilized in the present invention include, but are not limited to, polyurethane, polystyrene, esters of unsaturated or saturated fatty acids (e.g., glycerides), and so forth. For instance, suitable esters of fatty acids include, but are not limited to, esters of lauric acid, myristic acid, palmitic acid, stearic acid, eleostearic acid, oleic acid, linoleic acid, linolenic acid, aleuritic acid, shellolic acid, and so forth. These esters of fatty acids have been found particularly useful when used in relatively complex combinations to form a "drying oil", which allows the resulting film to rapidly polymerize into a stable layer. Such drying oils may include mono-, di-, and/or tri-glycerides, which have a glycerol backbone with one, two, and three, respectively, fatty acyl residues that are esterified. For instance, some suitable drying oils that may be used include, but are not limited to, olive oil, linseed oil, castor oil, tung oil, soybean oil, and shellac. These and other protective coating materials are described in more detail U.S. Pat. No. 6,674,635 to Fife, et al., which is incorporated herein in its entirety by reference thereto for all purposes.

The anodized part is thereafter subjected to a step for forming a cathode that includes a solid electrolyte, such as a manganese dioxide, conductive polymer, etc. A manganese dioxide solid electrolyte may, for instance, be formed by the pyrolytic decomposition of manganous nitrate ($Mn(NO_3)_2$). Such techniques are described, for instance, in U.S. Pat. No. 4,945,452 to Sturmer, et al., which is incorporated herein in its entirety by reference thereto for all purposes. Alternatively, a conductive polymer coating may be employed that contains one or more polyheterocycles (e.g., polypyrroles; polythiophenes, poly(3,4-ethylenedioxythiophene) (PEDT); polyanilines); polyacetylenes; poly-p-phenylenes; polyphenolates; and derivatives thereof. Moreover, if desired, the conductive polymer coating may also be formed from multiple conductive polymer layers. For example, in one embodiment, the conductive polymer cathode may contain one layer formed from PEDT and another layer formed from a polypyrrole. Various methods may be utilized to apply the conductive polymer coating onto the anode part. For instance, conventional techniques such as electropolymerization, screen-printing, dipping, electrophoretic coating, and spraying, may be used to form a conductive polymer coating. In one embodiment, for example, the monomer(s) used to form the conductive polymer (e.g., 3,4-ethylenedioxy-thiophene) may initially be mixed with a polymerization catalyst to form a solution. For example, one suitable polymerization catalyst is CLEVIOS C, which is iron III toluene-sulfonate and sold by H.C. Starck. CLEVIOS C is a commercially available catalyst for CLEVIOS M, which is 3,4-ethylene dioxythiophene, a PEDT monomer also sold by H.C. Starck. Once a catalyst dispersion is formed, the anode part may then be dipped into the dispersion so that the polymer forms on the surface of the anode part. Alternatively, the catalyst and monomer(s) may also be applied separately to the anode part. In one embodiment, for example, the catalyst may be dissolved in a solvent (e.g., butanol) and then applied to the anode part as a dipping solution. The anode part may then be dried to remove the solvent therefrom. Thereafter, the anode part may be dipped into a solution containing the appropriate monomer. Once the monomer contacts the surface of the anode part containing the catalyst, it chemically polymerizes thereon. In addition, the catalyst (e.g., CLEVIOS C) may also be mixed with the material(s) used to form the optional protective coating (e.g., resinous materials). In such instances, the anode part may then be dipped into a solution containing the monomer (CLEVIOS M). As a result, the monomer can contact the catalyst within and/or on the surface of the protective coating and react therewith to form the conductive polymer coating. Although various methods have been described above, it should be understood that any other method for applying the conductive coating(s) to the anode part may also be utilized in the present invention. For example, other methods for applying such conductive polymer coating(s) may be described in U.S. Pat. No. 5,457,862 to Sakata, et al., U.S. Pat. No. 5,473,503 to Sakata, et al., U.S. Pat. No. 5,729,428 to Sakata, et al., and U.S. Pat. No. 5,812,367 to Kudoh, et al., which are incorporated herein in their entirety by reference thereto for all purposes.

In most embodiments, once applied, the solid electrolyte is healed. Healing may occur after each application of a solid electrolyte layer or may occur after the application of the entire coating. In some embodiments, for example, the solid electrolyte may be healed by dipping the pellet into an electrolyte solution, such as a solution of phosphoric acid and/or sulfuric acid, and thereafter applying a constant voltage to the solution until the current is reduced to a preselected level. If desired, such healing may be accomplished in multiple steps. For instance, in one embodiment, a pellet having a conductive polymer coating is first dipped in phosphoric acid and applied with about 20 Volts and then dipped in sulfuric acid and applied with about 2 Volts. In this embodiment, the use of the second low voltage sulfuric acid solution or toluene sulfonic acid can help increase capacitance and reduce the dissipation factor (DF) of the resulting capacitor. After application of some or all of the layers described above, the pellet may then be washed if desired to remove various byproducts, excess catalysts, and so forth. Further, in some instances, drying may be utilized after some or all of the dipping operations described above. For example, drying may be desired after applying the catalyst and/or after washing the pellet in order to open the pores of the pellet so that it can receive a liquid during subsequent dipping steps.

If desired, the part may optionally be applied with a carbon layer (e.g., graphite) and silver layer, respectively. The silver coating may, for instance, act as a solderable conductor, contact layer, and/or charge collector for the capacitor and the carbon coating may limit contact of the silver coating with the solid electrolyte. Such coatings may cover some or all of the solid electrolyte.

As indicated above, the electrolytic capacitor of the present invention also contains an anode termination to which the anode lead of the capacitor element is electrically connected and a cathode termination to which the cathode of the capacitor element is electrically connected. Any conductive material may be employed to form the terminations, such as a conductive metal (e.g., copper, nickel, silver, nickel, zinc, tin, palladium, lead, copper, aluminum, molybdenum, titanium, iron, zirconium, magnesium, and alloys thereof). Particularly suitable conductive metals include, for instance, copper, copper alloys (e.g., copper-zirconium, copper-magnesium, copper-zinc, or copper-iron), nickel, and nickel alloys (e.g., nickel-iron). The thickness of the terminations is generally selected to minimize the thickness of the capacitor. For instance, the thickness of the terminations may range from about 0.05 to about 1 millimeter, in some embodiments from about 0.05 to about 0.5 millimeters, and from about 0.07 to about 0.2 millimeters. One exemplary conductive material is a copper-iron alloy metal plate available from Wieland (Germany). If desired, the surface of the terminations may be electroplated with nickel, silver, gold, tin, etc. as is known in the art to ensure that the final part is mountable to the circuit board. In one particular embodiment, both surfaces of the terminations are plated with nickel and silver flashes, respectively, while the mounting surface is also plated with a tin solder layer.

Figure 1:
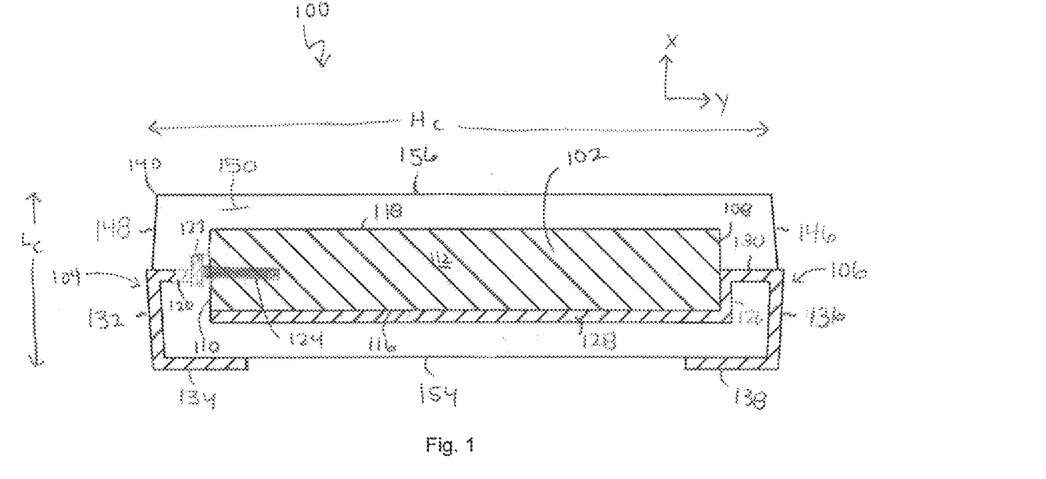
FIG. 1 is a cross-sectional view of one embodiment of one of plurality of active solid electrolytic capacitors contemplated for use in the module of the present invention.

Referring to FIG. 1, one embodiment of an active capacitor 100 that can be used in the solid electrolytic capacitor module of the present invention is shown that includes an anode termination 104 and a cathode termination 106 in electrical connection with a capacitor element 102. In FIG. 1, one possible configuration for the internal components of the anode termination 104 and the cathode termination 106 is described, although it is to be understood that any other suitable configuration can be used. The capacitor element 102 has an upper surface 108, a lower surface 110, a front surface 112, a rear surface (not shown), a first side surface 116, and a second side surface 118. Although it may be in electrical contact with any of the surfaces of the capacitor element 102, the cathode termination 106 in the illustrated embodiment is in electrical contact with the upper surface 108 and the first side surface 116. More specifically, as shown in FIG. 1, the cathode termination 106 contains a first internal component 126 positioned generally perpendicular to a second internal component 128, as well as a third internal component 130 that is connected to and generally perpendicular to the first internal component 126. The first internal component 126 is in electrical contact and generally parallel with the upper surface 110 of the capacitor element 102. Further, the second internal component 128 is in electrical contact and generally parallel to the first side surface 116 of the capacitor element 102, and the third internal component 130 is used to connect the internal components of the cathode termination 106 to the external components of the cathode termination 106. Specifically, the third internal component 130 is connected to the first external component 136 of the cathode termination 106, which is connected to and generally parallel to an upper surface 146 of the case 140. The cathode termination 106 also includes a second external component 138, which is connected to and generally parallel to a first side surface 154 of the case 140 near its upper surface 146. Although depicted as being integral, it should be understood that these components may alternatively be separate pieces that are connected together, either directly or via an additional conductive element (e.g., metal). Further, the components can be connected to the case 140 via any suitable method, such as via a conductive adhesive.

Referring still to FIG. 1, the anode termination 104 contains a first internal component 120 positioned generally perpendicular to a second internal component 122. The first internal component 120 is generally parallel with the first side surface 116 and side second surface 118 of the capacitor element 102, while the second internal component 122 is generally perpendicular to the first internal component 120 and the first side surface 116 and second side surface 118 of the capacitor element 102. Further, the second internal component 122 can contain a region (not shown), such as a U-shaped region, that carries an anode lead 128 for further enhancing surface contact and mechanical stability of the lead 128, while the first internal component 120 is used to connect the internal components of the anode termination 104 to the external components of the anode termination 104. Specifically, the first internal component 120 is connected to the first external component 132 of the anode termination 104, which is connected to and generally parallel to a lower surface 148 of the case 140. The anode termination 104 also includes a second external component 134, which is connected to and generally parallel to a first side surface 154 of the case 140 near its lower surface 148. Although depicted as being integral, it should be understood that these components may alternatively be separate pieces that are connected together, either directly or via an additional conductive element (e.g., metal). Further, the components can be connected to the case 140 via any suitable method, such as via a conductive adhesive.

It should also be understood that the internal components of the anode termination 104 and the cathode termination 106 can be arranged as shown in FIG. 1 or via any other suitable arrangement known to one of ordinary skill in the art. Further, the internal components of the anode termination 104 and the cathode termination 106 may be connected to portions of the capacitor element 102 using any technique known in the art. In one embodiment, for example, a conductive adhesive may initially be applied to a surface of the first internal component 126 and second internal component 128 of the cathode termination 106. The conductive adhesive may include, for instance, conductive metal particles contained with a resin composition. The metal particles may be silver, copper, gold, platinum, nickel, zinc, bismuth, etc. The resin composition may include a thermoset resin (e.g., epoxy resin), curing agent (e.g., acid anhydride), and coupling agent (e.g., silane coupling agents). Suitable conductive adhesives may be described in U.S. Patent Application Publication No. 2006/0038304 to Osako, et al., which is incorporated herein in its entirety by reference thereto for all purposes. Any of a variety of techniques may be used to apply the conductive adhesive to the first internal component 126 and the second internal component 128 of the cathode termination 106. Printing techniques, for instance, may be employed due to their practical and cost-saving benefits.

In addition, a variety of methods may generally be employed to attach the terminations to the capacitor element 102. In one embodiment, for example, the second internal component 122 of the anode termination 104 and the first internal component 126 of the cathode termination 106 are initially bent upward to the position shown in FIG. 1. Thereafter, the capacitor element 102 is positioned on the cathode termination 104 so that its first side surface 116 contacts the adhesive and the anode lead 128 is received by, for instance, an upper U-shaped region (not shown) of the second internal component 122 of the anode termination 104.

The anode lead 128 can be then electrically connected to the second internal component 122 of the anode termination 104 using any technique known in the art, such as mechanical welding, laser welding, conductive adhesives, etc. For example, the anode lead 128 may be welded to the second internal component 122 of the anode termination 104 using a laser. Lasers generally contain resonators that include a laser medium capable of releasing photons by stimulated emission and an energy source that excites the elements of the laser medium. One type of suitable laser is one in which the laser medium consist of an aluminum and yttrium garnet (YAG), doped with neodymium (Nd). The excited particles are neodymium ions $Nd^{3+}$. The energy source may provide continuous energy to the laser medium to emit a continuous laser beam or energy discharges to emit a pulsed laser beam. Upon electrically connecting the anode lead 128 to the anode termination 104, the conductive adhesive may then be cured. For example, a heat press may be used to apply heat and pressure to ensure that the electrolytic capacitor element 102 is adequately adhered to the first internal component 126 and the second internal component 128 of the cathode termination 106 by the adhesive.

Once the capacitor element 102 is attached, the internal components of the anode termination 104 and cathode termination 106 are enclosed within a resin case 140 having an upper surface 146, a lower surface 148, a front surface 150, a rear surface (not shown), a first side surface 154, and a second side surface 156, as described above, which may then be filled with silica or any other known encapsulating material. The specific height $H_C$, length $L_C$, and width $W_C$ of the case 140 may vary depending on the intended application, although the height $H_C$ is generally greater than the length $L_C$ and the width $W_C$. Suitable casings may include, for instance, "A", "B", "E", "F", "G", "H", "J", "K", "L", "M", "N", "P", "R", "S", "T", "W", "Y", or "X" cases (AVX Corporation). Regardless of the case size employed, the capacitor element 102 is encapsulated so that at least a portion of the anode termination 104 and cathode termination 106 are exposed so that the cathode termination 106 can be connected to conductor 170 (see FIGS. 3-4) and the anode termination 104 can be eventually mounted onto a conductive member 192 of a circuit board 188 that includes a substrate 190 having a mounting surface 194 (see FIG. 6), after the active capacitor 100 is assembled with additional active capacitor elements (e.g., 100A, 100B, 100C, 100D, 100E) and the sacrificial capacitor 200 into the solid electrolytic capacitor module 300 having a shell 172 as discussed in more detail below and as shown in FIGS. 3-6.

Figure 2:
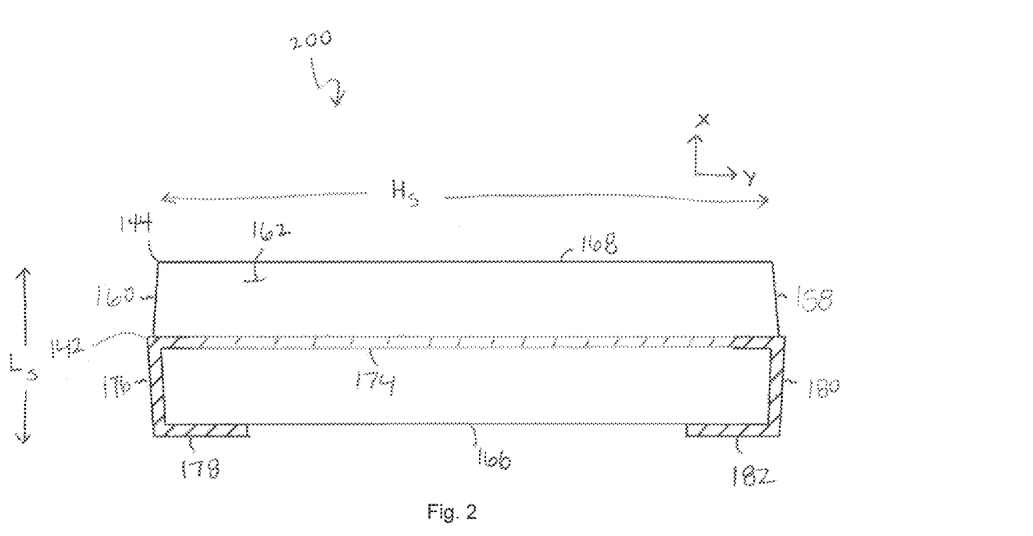
FIG. 2 is a cross-sectional view of one embodiment of a sacrificial capacitor contemplated for use in the module of the present invention.

Referring now to FIG. 2, one embodiment of a sacrificial capacitor 200 that is free of a capacitor element and that can be used in conjunction with a plurality of active capacitors such as active capacitor 100 described above to form a solid electrolytic capacitor module 300 is shown. The sacrificial capacitor 200 includes a case 144 that can surround a lead frame 142. Any conductive material may be employed to form the lead frame 142, such as a conductive metal (e.g., copper, nickel, silver, nickel, zinc, tin, palladium, lead, copper, aluminum, molybdenum, titanium, iron, zirconium, magnesium, and alloys thereof). Particularly suitable conductive metals include, for instance, copper, copper alloys (e.g., copper-zirconium, copper-magnesium, copper-zinc, or copper-iron), nickel, and nickel alloys (e.g., nickel-iron). Further, the case 144 can be resin and can be filled with silica or any other known encapsulating material and has an upper surface 158, a lower surface 160, a front surface 162, a rear surface (not shown), a first side surface 166, and a second side surface 168. In FIG. 2, it is to be understood that one possible configuration for the arrangement of the lead frame 142 components with respect to the case 144 is described, although it is to be understood that any other suitable configuration can be used. Specifically, as shown in FIG. 2, the lead frame 142 can extend along the height $H_S$ of the sacrificial capacitor 300 so that it includes an internal component 174 that is generally parallel to the first side surface 166 and the second side surface 168 of the case 144. The lead frame 142 also includes a first external component 176, a second external component 178, a third external component 180, and a fourth external component 182. The first external component 176 is connected to and generally parallel to the lower surface 160 of the case 144, while the second external component 178 is connected to and generally parallel to the first side surface 166 of the case 144 near its lower surface 160. Additionally, the third external component 180 is connected to and generally parallel to the upper surface 158 of the case 144, while the fourth external component 182 is connected to and generally parallel to the first side surface 166 of the case 144 near its upper surface 158. Although depicted as being integral, it should be understood that these components may alternatively be separate pieces that are connected together, either directly or via an additional conductive element (e.g., metal).

Figure 3:
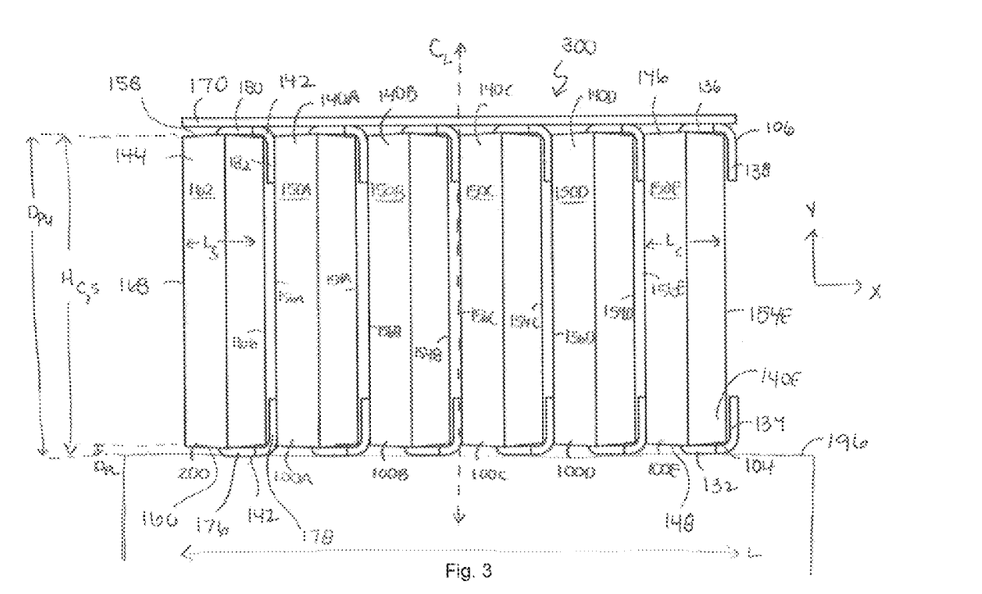
FIG. 3 is a front surface view of one embodiment of the module of the present invention including a plurality of active solid electrolytic capacitors as described in FIG. 1, a sacrificial capacitor as described in FIG. 2, and a conductor to connect the cathode terminations of the plurality of active solid electrolytic capacitors to each other.

Further, the components of the lead frame 142 can be connected to the case 144 via any suitable method, such as via a conductive adhesive. It should also be understood that the internal and external components of the lead frame 142 can be arranged as shown in FIG. 3 or via any other suitable arrangement known to one of ordinary skill in the art. The resulting sacrificial capacitor 200 has a height $H_S$, a length $L_S$, and a width $W_S$ as defined by the case 144, where the dimensions may vary depending on the intended application, but where the height $H_S$ us generally greater than the length $L_S$ and the width $W_S$. Suitable casings may include, for instance, "A", "B", "E", "F", "G", "H", "J", "K", "L", "M", "N", "P", "R", "5", "T", "W", "Y", or "X" cases (AVX Corporation), and it should be understood that the sacrificial capacitor 200 can have dimensions that are substantially identical to the plurality of active capacitors 100A, 100B, 100C, 100D, and 100E that are contained within the module 300 adjacent the sacrificial capacitor 200. Further, regardless of the case size employed, the first external component 176 of the lead frame 142 is sufficiently exposed so that the lead frame 142 can be eventually mounted onto a conductive member 192 of a circuit board 188 that includes a substrate 190 having a mounting surface 194 (see FIG. 6), and the third external component 180 is sufficiently exposed so that the lead frame 142 can be connected to conductor 170 (see FIGS. 3-4) at the upper surface 158 of the case 144.

Turning now to FIGS. 3-6, the arrangement of active solid electrolytic capacitors 100A, 100B, 100C, 100D, and 100E along with a sacrificial capacitor 200 to form the solid electrolytic capacitor module 300 is discussed in more detail. As an initial matter, it is to be understood that although the module 300 includes five active capacitors (100A, 100B, 100C, 100D, and 100E) used in conjunction with one sacrificial capacitor 200, any number of active capacitors and sacrificial capacitors can be utilized. In the particular embodiment of FIG. 3, where five active capacitors are utilized, active capacitors 100A, 100B, 100C, 100D, and 100E can be arranged on a planar surface 196 such that the lower surface 148 of each capacitor case 140 is parallel to the planar surface 196, where the front surfaces 150A, 150B, 150C, 150D, and 150E are perpendicular to the planar surface 196. As shown, the first external component 132 of the anode termination 104 of active capacitor 100E is in contact with and parallel to the planar surface 196. Further, the active capacitors 100A-D are arranged in a similar fashion such that their first external components (not labeled for simplicity, but correspond to first external component 132 shown for capacitor 100E) of their anode terminations 104 are also in contact with and parallel to the planar surface 196. Moreover, the capacitors active 100A-100E are arranged in a row such that front surfaces 150A-150E of their casings 140 face the same direction and such that the first side surfaces 154 of the casing of one active capacitor is positioned adjacent and parallel to the second side surface 156 of the casing its neighboring active capacitor. Specifically, the first side surface 154A of the casing 140A of active capacitor 100A is adjacent the second side surface 156B of the casing 140B of active capacitor 100B, the first side surface 154B of the casing 140B of active capacitor 100B is adjacent the second side surface 156C of the casing 140C of active capacitor 100C, the first side surface 154C of the casing 140C of active capacitor 100C is adjacent the second side surface 156D of the casing 140D of active capacitor 100D, the first side surface 154D of the casing 140D of active capacitor 100D is adjacent the second side surface 156E of the casing 140E of active capacitor 100E, and the first side surface 154E of the casing 140E of active capacitor 100E is exposed as active capacitor 100E is the fifth active capacitor in the 5-active capacitor module 300.

Figure 4:
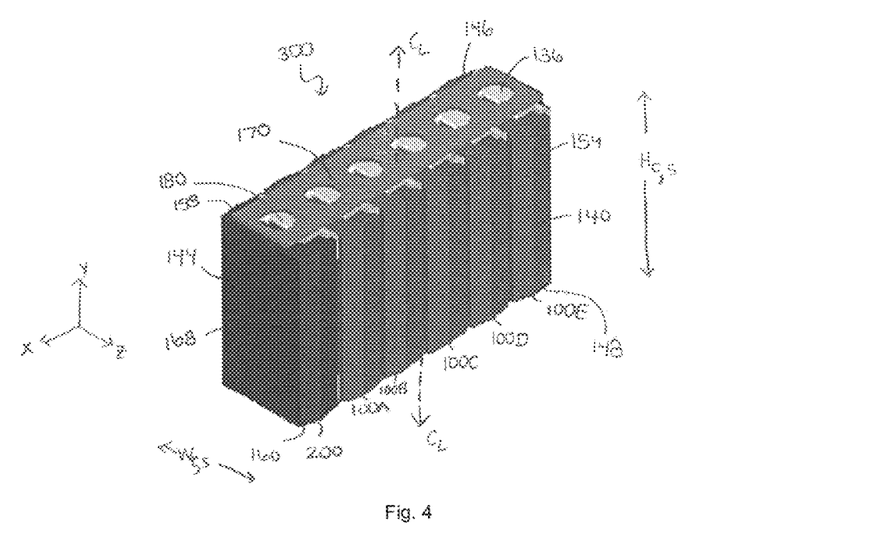
FIG. 4 is a perspective view of the module of FIG. 3.
Figure 5:
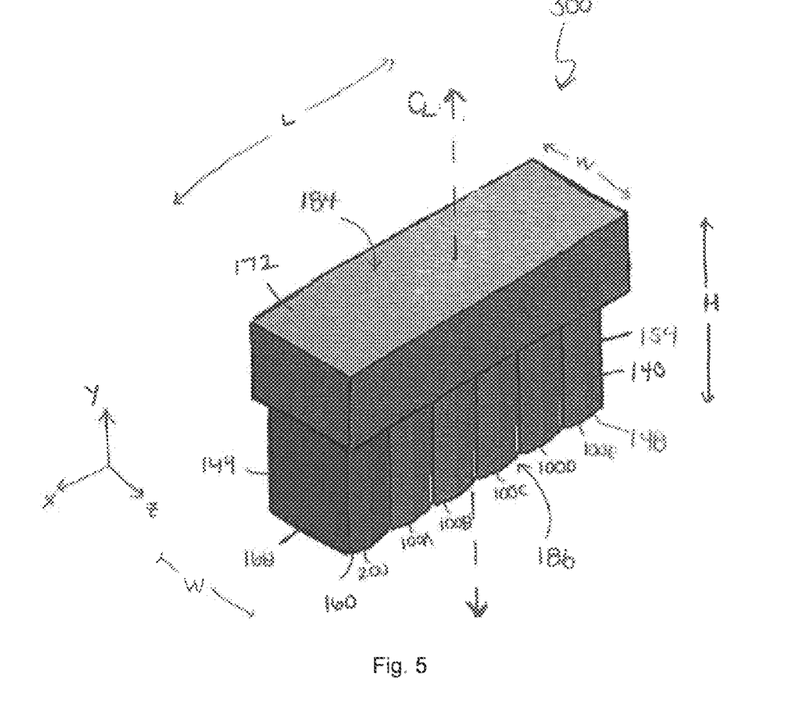
FIG. 5 is a perspective view of the module of FIG. 4 after the cathode termination ends of the plurality of active solid electrolytic capacitors have been positioned inside a shell.

Further, the sacrificial capacitor 200 is positioned so that its first external component 176 of its lead frame 142 is in contact with and parallel to the planar surface 196. As shown, as a result of forming the module 300 by placing the first external component 176 of the lead frame 142 of the sacrificial capacitor 200 and the first external components 132 of the anode terminations 104 of the active capacitors 100A-100E against a planar surface 196, the lower surfaces of the active capacitor cases 140A-140E and the lower surface of the sacrificial capacitor case 144 are generally coplanar, as are the first external components 132 of the anode terminations 104 and the first external component 176 of the lead frame 142. As shown in FIGS. 3-6, the active capacitors and the sacrificial capacitor can have substantially identical dimensions, where the length $L_C$, height $H_C$, and width $W_C$ of the active capacitors 100A-100E is the same as the length $L_S$, height $H_S$, and width $W_S$ of the sacrificial capacitor 200, which can contribute to the planarity and resulting mechanical and electrical stability of the module 300, as well as the symmetry of the cases 140A-E and 144 about cut line $C_L$ at the midpoint of the length L of the module 300. The cut line $C_L$ also represents the center of gravity of the resulting module, which can be located along a midpoint of an overall length L of the module in the horizontal or x direction, along a midpoint of an overall width W of the module in the transverse or z direction, or both, as shown in FIGS. 3-5, where the location of the center of gravity at such midpoints further contributes to the planarity and resulting mechanical and electrical stability of the module 300.

After the active capacitors 100A-100E and sacrificial capacitor are arranged on the planar surface 196 as described above, the first external components 136 of the cathode terminations 106 for the active capacitors 100A-100E and the third external component 180 of the lead frame 142 are joined to a conductor 170. The conductor 170 can be formed any conductive material such as a conductive metal (e.g., copper, nickel, silver, nickel, zinc, tin, palladium, lead, copper, aluminum, molybdenum, titanium, iron, zirconium, magnesium, and alloys thereof). Particularly suitable conductive metals include, for instance, copper, copper alloys (e.g., copper-zirconium, copper-magnesium, copper-zinc, or copper-iron), nickel, and nickel alloys (e.g., nickel-iron). Further, referring to FIGS. 3 and 4, the conductor 170 connects the cathode terminations 106 of the active capacitors 100A-100E to each other and then to the third external component 180 of the lead frame 142. The lead frame 142, in turn, facilitates the electrical connection of the cathode terminations 106 to a circuit board 188 via a conductive member 192 located on a mounting surface 194 of substrate 190 of the circuit board 188, where the first external component 176 of the lead frame is disposed on the conductive member 192, as shown in FIG. 6.

Figure 6:
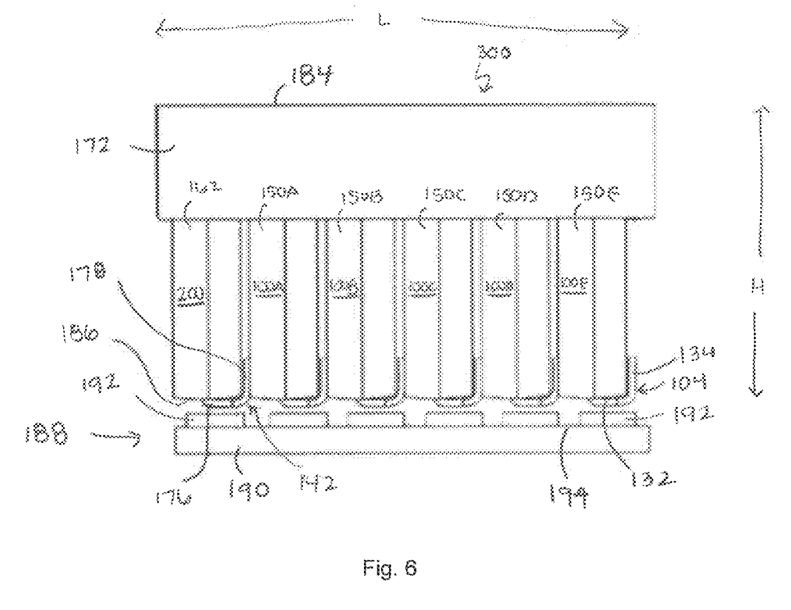
FIG. 6 is a front surface view of a circuit board including a substrate and the module of the present invention mounted thereto.

Additionally, as shown in FIGS. 5 and 6, after the conductor 170 has been connected to the various components of the module 300 as described above, a plastic shell 172 can be placed around conductor 170, the upper surfaces 146 of the active capacitor cases, and the upper surface 158 of the sacrificial capacitor case, where the shell 172 defines the upper module surface 186 and extends along a portion of the height H of the module 300. As shown, the shell 172 does not extend to the lower module surface 186 such that a portion of the front surfaces 150A-150E and the rear surfaces (not shown) of the active capacitors 100A-100E are exposed along the height H of the module 300, such that a portion of the front surface 162 and the rear surface (not shown) of the sacrificial capacitor 200 are exposed along the height H of the module 300, and such that that a portion of the second side surface 168 of the sacrificial capacitor 200 and a portion of the first side surface 154 of the active capacitor 100E are exposed along the height H of the module 300 in the vertical or y direction.

Further, although the discussion above refers to the mounting of the anode terminations of the plurality of active capacitors to the circuit board and the electrical connection of each of the cathode terminations to each other in series via the conductor, followed by positioning a shell around the cathode terminations ends of the active capacitors, it is also to be understood that the present invention also contemplates the opposite arrangement where the cathode terminations of the plurality of active capacitors are mounted to the circuit board and where the anode terminations are electrically connected to each other in series via the conductor. In any event, regardless of whether the anode terminations are positioned at the lower surface of the module and the cathode terminations are positioned at the upper surface of the module and vice versa, the particular arrangement of the active capacitors in conjunction with a sacrificial capacitor results in the formation of a module having a generally planar lower surface, a generally planar upper surface, or both.

For instance, referring to FIG. 3, the difference in distance $D_{PL}$ from a horizontal plane or planar surface 196 (e.g., a plane positioned some distance away from a lower surface of the module) between a lower surface 160 of the case 144 of the sacrificial capacitor 200 and a lower surface 148 of the case 140 of each of the active capacitors 100A-100E is less than about 0.005 inches (0.127 millimeters), such as less than about 0.004 inches (0.102 millimeters), such as less than about 0.003 inches (0.076 millimeters), such as less than about 0.002 inches (0.051 millimeters), such as less than about 0.001 inches (0.026 millimeters). In one particular embodiment, the difference in distance $D_{PL}$ from a horizontal plane or planar surface 196 between a lower surface 160 of the case 144 of the sacrificial capacitor 200 and a lower surface 148 of the case 140 of each of the active capacitors 100A-100E is 0 inches (0 millimeters). Likewise, the difference in distance $D_{PU}$ from a horizontal plane or planar surface 196 (e.g., a plane positioned some distance away from an upper surface of the module) between an upper surface 158 of the case 144 of the sacrificial capacitor 200 and an upper surface 146 of the case 140 of each of the active capacitors 100A-100E is less than about 0.005 inches (0.127 millimeters), such as less than about 0.004 inches (0.102 millimeters), such as less than about 0.003 inches (0.076 millimeters), such as less than about 0.002 inches (0.051 millimeters), such as less than about 0.001 inches (0.026 millimeters). In one particular embodiment, the difference in distance $D_{PU}$ from a horizontal plane or planar surface 196 between an upper surface 158 of the case 144 of the sacrificial capacitor 200 and an upper surface 146 of the case 140 of each of the active capacitors 100A-100E is 0 inches (0 millimeters).

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A solid electrolytic capacitor module having an upper module surface and a lower module surface, the module comprising:
    a plurality of active capacitors, each active capacitor comprising a capacitor element and an active capacitor case that encapsulates the capacitor element,
    wherein the active capacitor case includes an upper surface adjacent the upper module surface,
    a lower surface adjacent the lower module surface, opposing side surfaces, a front surface, and a rear surface;
    an anode termination having a first external component contacting and parallel to the lower surface of the active capacitor case;
    and a cathode termination having a first external component contacting and parallel to the upper surface of the active capacitor case;
    a sacrificial capacitor comprising a sacrificial capacitor case, wherein the sacrificial capacitor case includes an upper surface, a lower surface, opposing side surfaces, a front surface, and a rear surface,
    wherein the plurality of active capacitors and the sacrificial capacitor are aligned along a horizontal direction so that the side surfaces of the active capacitor cases and the side surfaces of the sacrificial capacitor case are parallel to each other;
    and a conductor, wherein the conductor is positioned along the horizontal direction at the upper module surface so that the conductor is in contact with the first external component of the cathode termination of each of the plurality of active capacitors.

2. The module of claim 1, wherein the lower surface of the sacrificial capacitor case and the lower surfaces of the active capacitor cases are coplanar.

3. The module of claim 1, wherein the module has a center of gravity located along a midpoint of an overall length of the module, along a midpoint of an overall width of the module, or both.

4. The module of claim 1, wherein the sacrificial capacitor further comprises a lead frame.

5. The module of claim 4, wherein the lead frame includes a first external component and a second external component located at a lower surface of the sacrificial capacitor case, a third external component and a fourth external component located at an upper surface of the case, and an internal component disposed along the length of the sacrificial capacitor case.

6. The module of claim 5, wherein the first external component contacts and is parallel to the lower surface of the case, the second external component contacts and is parallel to the first side surface of the case, the third external component contacts and is parallel to the upper surface of the case, and the fourth external component contacts and is parallel to the first side surface of the case.

7. The module of claim 5, wherein the first external component of the lead frame is configured to be mounted to a circuit board.

8. The module of claim 5, wherein the first external component of the lead frame and the first external component of the anode termination for each of the plurality of active capacitors are generally coplanar.

9. The module of claim 5, wherein the conductor is connected to the third external component of the lead frame.

10. The module of claim 1, wherein the first external component of the anode termination is configured to be mounted to a circuit board.

11. The module of claim 1, wherein the anode termination has a second external component contacting and parallel to the one of the side surfaces of the active capacitor case, and wherein the cathode termination has a second external component contacting and parallel to one of the side surfaces of the active capacitor case.

12. The module of claim 1, wherein a difference in distance from a horizontal plane between the lower surface of the sacrificial capacitor case and the lower surface of each of the active capacitor cases is less than 0.005 inches (0.127 millimeters).

13. The module of claim 1, wherein the upper surfaces of the capacitor cases and the upper surface of the sacrificial capacitor case are surrounded by a shell.

14. The module of claim 1, wherein the capacitor element includes an anode, a dielectric layer overlying the anode, and a cathode overlying the dielectric layer that includes a solid electrolyte.

15. The module of claim 14, wherein the anode includes tantalum, niobium, or an electrically conductive oxide thereof and wherein the solid electrolyte includes manganese dioxide, a conductive polymer, or a combination thereof.

16. A circuit board comprising:
 a substrate that includes a mounting surface, wherein a plurality of conductive members are disposed on the mounting surface; and
 the module of claim 1, wherein the sacrificial capacitor further comprises a lead frame, wherein the lead frame comprises an external component located at a lower surface of the sacrificial capacitor case, wherein the external component contacts and is parallel to the lower surface of the sacrificial capacitor case, further wherein the first external component of each of the anode terminations is connected to one of the plurality of conductive members and the external component of the lead frame is connected to one of the plurality of conductive members.

\* \* \* \* \*